(12) United States Patent
Lopez (10) Patent No.: US 12,081,204 B2
(45) Date of Patent: Sep. 3, 2024

(54) POWER SWITCH

(71) Applicant: STMicroelectronics (Rousset) SAS, Rousset (FR)

(72) Inventor: Laurent Lopez, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 13 days.

(21) Appl. No.: 17/885,086

(22) Filed: Aug. 10, 2022

(65) Prior Publication Data
US 2023/0064471 A1 Mar. 2, 2023

(30) Foreign Application Priority Data
Aug. 24, 2021 (FR) ........................................ 2108858

(51) Int. Cl.
*H03K 17/16* (2006.01)
(52) U.S. Cl.
CPC .................................. *H03K 17/161* (2013.01)
(58) Field of Classification Search
CPC .............................. H03K 17/161; G06F 1/263
See application file for complete search history.

(56) References Cited

U.S. PATENT DOCUMENTS

| | | | |
|---|---|---|---|
| 5,517,153 A | 5/1996 | Yin et al. | |
| 9,836,071 B2* | 12/2017 | Atkinson | .............. H02J 7/0063 |
| 9,985,129 B2* | 5/2018 | Hsiao | .................. H01L 29/7823 |
| 2008/0030078 A1* | 2/2008 | Whitted | .................. H02J 9/061 |
| | | | 307/66 |
| 2015/0028676 A1 | 1/2015 | Kiya | |

OTHER PUBLICATIONS

INPI Search Report and Written Opinion for priority application, FR 2108858, report dated Mar. 24, 2022, 9 pgs.

* cited by examiner

*Primary Examiner* — Ryan Johnson
*Assistant Examiner* — Colleen J O'Toole
(74) *Attorney, Agent, or Firm* — Crowe & Dunlevy LLC (57) ABSTRACT

A power switch device includes a first terminal intended to be connected to a source of a first supply potential, a second terminal configured to supply a second potential, and a third terminal intended to be connected to a second source of a third supply potential. The device includes a first PMOS transistor having a source connected to the second terminal and a drain connected to the third terminal, a second PMOS transistor having a source connected to the second terminal, and a third PMOS transistor having a source connected to the first terminal and a drain connected to the drain of the second transistor. A control circuit generates gate control signals to control operation of the first, second and third PMOS transistors dependent on the first, second, and third supply potentials.

12 Claims, 3 Drawing Sheets

POWER SWITCH

PRIORITY CLAIM

This application claims the priority benefit of French Application for Patent No. 2108858, filed on Aug. 24, 2021, the content of which is hereby incorporated by reference in its entirety to the maximum extent allowable by law.

TECHNICAL FIELD

The present disclosure relates generally to electronic circuits and, more particularly, to power switches.

BACKGROUND

Power switches are circuit elements, for example, of integrated circuits, which receive a plurality of signals and provide, at an output terminal of the switch, one signal selected from the received signals. The signal selected from the received signals is determined based on at least one control signal provided to the power switch.

The power switches receive power potentials and supply a power potential selected from the received power potentials.

Known power switches suffer from various drawbacks.

There is a need to overcome at least some of the disadvantages of known power switches.

For example, it would be desirable to have a power switch that is less bulky than known power switches.

For example, it would be desirable to have a power switch implemented with metal oxide semiconductor (MOS) transistors configured to hold a lower maximum gate-to-source voltage than the power potentials received by the power switch and the power potential provided by the power switch.

For example, it would also be desirable to have a power switch and a switch control circuit that is powered by the power potentials received by the power switch and the power potential supplied by the power switch, and which is implemented with MOS transistors configured to hold a maximum gate-to-source voltage substantially equal to or equal to the maximum gate-to-source voltage that the MOS transistors of the switch can withstand, the latter being lower than at least one of the voltages received and supplied by the switch.

For example, it would be desirable to have a power switch and a switch control circuit that reduces current leakage in the switch.

SUMMARY

One embodiment addresses all or some of the drawbacks of known power switches.

One embodiment provides a device comprising: a first terminal for connection to a first voltage source supplying a first power supply potential referenced to ground; a second terminal configured to supply a second supply potential referenced to ground; a third terminal for connection to a second voltage source supplying a third power supply potential referenced to ground; a first PMOS transistor having a source connected to the second terminal and a drain connected to the third terminal; a second PMOS transistor having a source connected to the second terminal; and a third PMOS transistor having a source connected to the first terminal and a drain connected to the drain of the second PMOS transistor.

According to one embodiment, the device further comprises a control circuit for the first, second, and third transistors, the control circuit being configured to receive the first, second, and third supply potentials.

According to one embodiment, the control circuit is configured to receive a first binary signal, and to control the first, second, and third transistors at least based on the first signal, a first binary state of the first signal corresponding to a request to the control circuit to switch the second and third transistors to the on state and switch the first transistor to the off state, and a second binary state of the first signal corresponding to a request to the control circuit to switch the second and third transistors to the off state and switch the first transistor to the on state.

According to one embodiment, the control circuit is further configured to condition a switching to the on state of the second and third transistors to the fact that the first potential is non-zero.

According to one embodiment, the control circuit is further configured to compare the third supply potential to ground, and to force a switching of the third transistor to the on state if the third supply potential is zero.

According to one embodiment, the control circuit comprises: a first circuit configured to supply a first high reference potential equal to A times the first supply potential and a first low reference potential equal to B times the first supply potential, with A and B positive numbers strictly less than 1, A being greater than B; and a second circuit configured to supply a second high reference potential equal to C times the second supply potential and a second low reference potential equal to D times the second supply potential, with C and D positive numbers strictly less than 1, C being greater than D.

According to one embodiment, a maximum potential difference that can be applied between the gate and source of each of the first, second and third transistors determines the numbers A, B, C and D.

According to one embodiment, the control circuit comprises: a third circuit configured to receive a second binary signal comprised between ground and the first high reference potential and to provide, at the gate of the third transistor, a third binary signal determined by the second signal and comprised between the first low reference potential and the first supply potential; a fourth circuit configured to receive a fourth binary signal comprised between ground and the second high reference potential and to provide, at the gate of the second transistor, a fifth binary signal determined by the fourth signal and comprised between the second low reference potential and the second supply potential; and a fifth circuit configured to receive a sixth binary signal comprised between ground and the second high reference potential and to provide, at the gate of the first transistor, a seventh binary signal determined by the sixth signal and comprised between the second low reference potential and the second supply potential.

According to one embodiment, the control circuit comprises: a sixth circuit configured to be powered between the second high reference potential and ground, to receive the first binary signal, to provide the fourth and sixth signals; a seventh circuit configured to be powered between the first high reference potential and ground, to receive a binary signal from the sixth circuit comprised between the second high reference potential and ground, and to provide the second binary signal at least from the binary signal received from the sixth circuit.

According to one embodiment, the sixth circuit is configured to determine the state of the fourth and sixth signals and of the binary signal that the sixth circuit provides to the seventh circuit at least based on the first signal.

According to one embodiment: the control circuit further comprises an eighth circuit configured to receive the first high reference potential, to detect when the first high reference potential is strictly positive, and to provide to the sixth circuit an eighth binary signal comprised between the second high reference potential and ground and having a binary state determined by the said detection, and the sixth circuit is configured to determine the state of the fourth and sixth signals and of the binary signal that the sixth circuit provides to the seventh circuit at least based on the first signal and the eighth signal.

According to one embodiment, the seventh circuit comprises a ninth circuit configured to receive the binary signal received from the sixth circuit and provide a ninth binary signal determined by the received binary signal comprised between ground and the first high reference potential, the seventh circuit being configured to determine the state of the second binary signal at least based on the ninth binary signal.

According to one embodiment: the control circuit comprises a tenth circuit configured to supply a third high reference potential equal to E times the third supply potential, with E a positive number strictly less than 1 determined by the maximum potential difference that can be applied between the gate and the source of each of the first, second and third transistors; the control circuit comprises an eleventh circuit configured to receive the third high reference potential, to detect when the third high reference potential is strictly positive, and to provide the seventh circuit with a tenth binary signal comprised between the first high reference potential and ground and having a binary state determined by said detection; and the seventh circuit is configured to determine the state of the second binary signal at least based on the binary signal received from the sixth circuit and the tenth signal.

According to one embodiment, the first, second, and third transistors are drift PMOS transistors.

According to one embodiment, the device further comprises the first and second voltage sources.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the various usual electronic circuits and systems in which a power switch may be provided have not been detailed, as the described embodiments are compatible with such usual circuits and systems.

Unless indicated otherwise, when reference is made to two elements connected together, this signifies a direct connection without any intermediate elements other than conductors, and when reference is made to two elements coupled together, this signifies that these two elements can be connected, or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, as orientated during normal use.

Unless specified otherwise, the expressions "around", "approximately", "substantially" and "in the order of" signify within 10%, and preferably within 5%.

Figure 1:
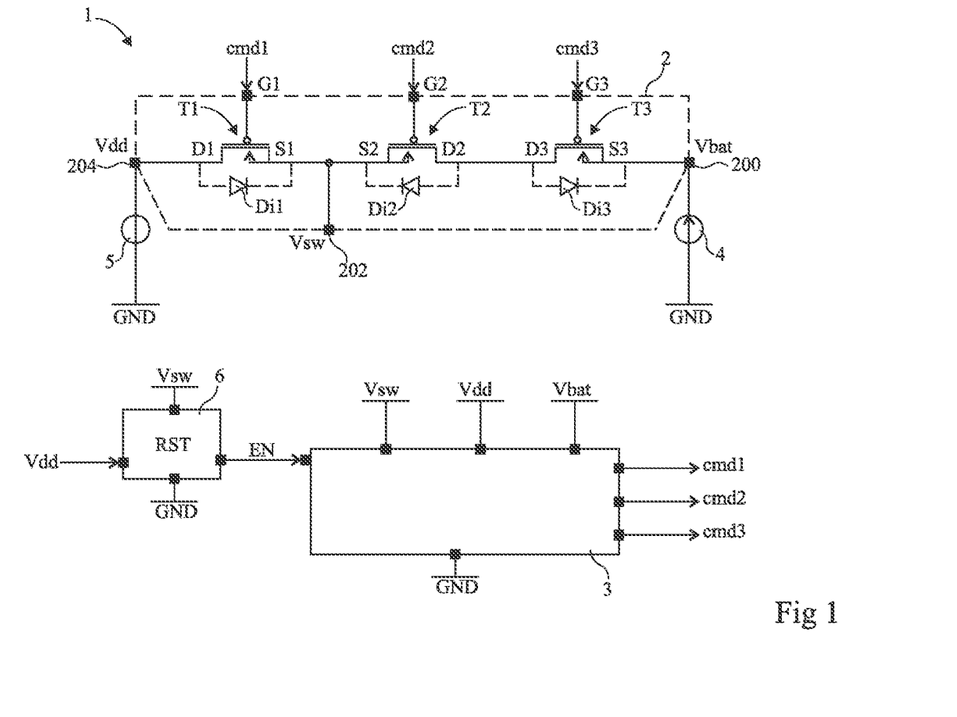
FIG. 1 represents one embodiment comprising a power switch and a switch control circuit.

FIG. 1 illustrates one embodiment of the device 1 comprising a power switch 2 and a circuit 3 for controlling the switch 2.

The switch 2, delineated by dashed lines in FIG. 1, comprises a terminal 200, a terminal 202 and a terminal 204.

The terminal 200 is intended to receive a supply potential Vbat, for example referenced to the ground GND and positive. In other words, the terminal 200 is intended to be connected to a voltage source 4 supplying the potential Vbat to terminal 200. For example, the voltage source 4 is a battery. For example, the potential Vbat has values up to 3.6 V. For example, the value of the potential Vbat may vary during operation of the device 1, for example between a zero value and a maximum value, for example equal to 3.6 V.

The terminal 204 is intended to receive a supply potential Vdd, for example referenced to the ground GND and positive. In other words, the terminal 204 is intended to be connected to a voltage source 5 supplying the potential Vdd to terminal 204. For example, the voltage source 5 is a main power source of a system comprising the device 1. For example, the potential Vdd has a nominal value of 3.6 V. For example, the value of the potential Vdd may vary during operation of the device 1, for example between a zero value and a maximum value, for example equal to 3.6 V. For example, the potential Vdd has a maximum value when the device 1 is connected to the main power supply, and a zero value otherwise.

The terminal 202 is configured to supply (i.e., output) a potential Vsw, for example referenced to ground GND and positive. For example, the potential Vsw is generated from the potentials Vbat and Vdd received by the switch 2. For example, the potential Vsw is the potential for supplying one or more electronic circuits coupled to the terminal 202, or, in other words, the terminal 202 is coupled to one or more electronic circuits configured to be supplied by the potential Vsw.

The switch 2 comprises a transistor T1. The transistor T1 is a P-channel MOS, or PMOS, transistor. The source-drain path of transistor T1 couples terminal 202 to terminal 204. The switch 2 comprises a single transistor, namely transistor T1, between its terminals 202 and 204. For example, the transistor T1 has its source S1 connected to terminal 202 and its drain D1 connected to terminal 204. The source S1 of the transistor T1 is connected to the body region of the transistor T1. The intrinsic diode Di1 of transistor T1 thus has its anode on the terminal 204 side, and its cathode on the terminal 202 side.

The switch 2 comprises a transistor T2 and a transistor T3 with source-drain paths coupled in series between the terminals 202 and 200. The transistors T2 and T3 are P-channel MOS, or PMOS, transistors. The transistors T2 and T3 couple the terminal 202 to terminal 200. Between the terminals 202 and 200, the switch 2 comprises only two transistors, namely transistors T2 and T3. For example, transistor T2 has its source S2 connected to terminal 202. The source S2 of the transistor T2 is connected to the body region of transistor T2. The intrinsic diode Di2 of transistor T2 thus has its anode on the terminal 200 side, and its cathode on the terminal 202 side. For example, transistor T3 has its source S3 connected to terminal 200 and its drain D3 connected to the drain D2 of the transistor T2. The source S3 of transistor T3 is connected to the body region of transistor T3. The intrinsic diode Di3 of transistor T3 thus has its anode on the terminal 202 side, and its cathode on the terminal 200 side.

The switch 2 is controlled by means of the signals cmd1, cmd2, and cmd3 applied to the gate G1 of the transistor T1, the gate G2 of transistor T2, and the gate G3 of transistor T3, respectively. For example, depending on the control signals cmd1, cmd2 and cmd3, the potential Vsw on the terminal 202 of switch 2 is selectively derived from the potential Vbat or the potential Vdd. In other words, depending on the control signals cmd1, cmd2, and cmd3, the potential Vsw is equal to the potential Vbat (neglecting the voltage drops in the transistors T2 and T3) or the potential Vdd (neglecting the voltage drop in transistor T1).

Compared to known power switches, the switch 2 comprises only one PMOS transistor between its terminals 202 and 204, namely the transistor T1, resulting in the switch 2 being less bulky than known switches.

Preferably, transistor T1 is half the size as each of the transistors T2 and T3, so that the impedance seen on terminal 202 when transistors T2 and T3 are in the off state and the transistor T1 is in the on state is the same as when the transistors T2 and T3 are in the on state and transistor T1 is in the off state.

For example, the switch 2 allows circuits to be powered with the potential Vsw derived from the potential Vdd when the potential Vdd is greater than a threshold Vth, and with the potential Vsw derived from the potential Vbat when the potential Vdd is less than the threshold Vth, for example when the potential Vdd is zero.

For example, the source 5 delivers a potential Vdd higher than the threshold Vth if the device 1 is connected to a main power supply and a potential Vdd lower than the threshold Vth, or even zero, if not. For example, source 4 is a battery of the device 1. The switch 2 then makes it possible to maintain a non-zero supply potential Vsw when the device 1 is disconnected from the main power supply 5 and the potential Vdd becomes zero, by coupling the terminals 200 and 202 (supply on battery 4), and, conversely, to save the battery 4 when the device 1 is coupled to the main power supply and the potential Vdd is higher than the threshold Vth, by coupling the terminals 204 and 202 (supply on the main power supply 5).

According to one embodiment, the device 1 comprises a circuit 6 ("RST" block in FIG. 1) configured to provide a binary signal EN to a first binary state when the potential Vdd is lower than the threshold Vth and to a second binary state when the potential Vdd is lower than the threshold Vth. For example, the circuit 6 comprises a terminal configured to provide the signal EN, and a terminal configured to receive the potential Vdd. For example, when the potential Vdd increases and exceeds the threshold Vth, the signal EN switches from its first binary state to its second binary state.

For example, the circuit 6 is powered by the potential Vsw, and then comprises a power terminal receiving the potential Vdd, and a power terminal connected to ground GND.

Preferably, the first binary state of the signal EN is a low state corresponding to the ground potential GND and the second binary state of the signal EN is a high state corresponding to the potential Vsw. Thus, when the potential Vsw is zero, the signal EN is by default in the low state, i.e., at ground GND.

The control circuit 3 is configured to control the transistors T1, T2 and T3. The circuit 3 receives the potentials Vdd, Vsw and Vbat.

According to one embodiment, the signal cmd1 is a binary signal whose high state corresponds to the potential Vsw, and whose low state corresponds to the ground potential GND, signal cmd2 is a binary signal whose high state corresponds to the potential Vsw and whose low state corresponds to the ground potential GND, and signal cmd3 is a binary signal, the high state of which corresponds to the potential Vbat and the low state corresponds to the ground potential GND.

According to one embodiment, the circuit 3 is configured to control the transistors T1, T2 and T3 at least based on the signal EN. The first binary state, for example the low state of the EN signal instructs the circuit 3 to drive the transistors T1, T2, and T3 to electrically couple the terminals 200 and 202 and to electrically isolate the terminals 204 and 202, and the second binary state, for example, the high state, of the EN signal instructs the circuit 3 to drive the transistors T1, T2, and T3 to electrically couple the terminals 204 and 202 and to electrically isolate the terminals 200 and 202. In other words, the first binary state of the signal EN corresponds to a request to the circuit 3 to switch transistors T2 and T3 to the on state and switch the transistor T1 to the off state, and the second binary state of the signal EN corresponds to a request to the circuit 3 to switch the transistors T2 and T3 to the off state and switch the transistor T1 to the on state.

For example, the case is considered where the potential Vdd is higher than the threshold Vth and the potential Vsw is non-zero. In this case, when the signal EN is in its second binary state, the circuit 3 applies, for example, the low state of the signal cmd1 to the gate G1 of the transistor T1, which is then in the on state, the high state of the signal cmd2 to the gate G2 of the transistor T2, which is then in the off state, and the high state of the signal cmd3 to the gate of the transistor T3, which is then in the off state.

Again, by way of example, the case is considered where the potential Vbat is non-zero, the potential Vsw is non-zero and the potential Vdd is lower than the threshold Vth. In this case, the signal EN is in its first binary state and the circuit 3 applies, for example, the high state of the signal cmd1 to the gate G1 of the transistor T1 which is then in the off state, the low state of the signal cmd2 to the gate G2 of the transistor T2 which is then in the on state, and the low state of the signal cmd3 to the gate G3 of the transistor T3 which is then in the on state.

Again, by way of example, when the potentials Vsw and Vbat are zero, the low state of the signal cmd1, when applied to the gate G1 of the transistor T1, does not allow the transistor T1 to be switched to the on state. However, the application of a non-zero potential Vdd on the terminal 204 causes a current to flow from the terminal 204 to the terminal 202, via the diode Di1, which allows the potential Vsw to increase. The signal cmd1 is maintained at its low state, and the increase in potential Vsw causes the voltage between the gate G1 and the source S1, or the gate-source voltage of the transistor T1, to become sufficient for the transistor T1 to switch to the on state and thus couple terminals 204 and 202. Preferably, during this operating phase, the circuit 3 applies the high state of the signal cmd2 to the gate G2 of the transistor T2, so that the gate-source voltage of the transistor T2 remains zero and the transistor T2 remains in the off state, thereby avoiding current leakage from the terminal 204 to the terminal 200, via the diode Di1 or the transistor T1 in the on state, the transistor T2 and the diode Di3.

Again, by way of example, when the potentials Vsw and Vdd are zero, the application of the low level of the signal cmd3 to the gate G3 of the transistor T3 makes it possible, when the potential Vbat is sufficiently high, to switch the transistor T3 to the on state. On the other hand, the low level of the signal cmd2, when applied to the gate G2 of the transistor T2, does not allow the transistor T2 to be switched to the on state. However, because the transistor T3 is in the on state, a current flows from the terminal 200 to the terminal 202, via the transistor T3 which is in the on state, and the diode Di2, and the potential Vsw increase. The increase of the potential Vsw and the maintenance of the signal cmd2 in the low state cause the voltage between the gate G2 and the source S2, or the gate-source voltage of the transistor T2, to become sufficient for the transistor T2 to switch to the on state. The two transistors T2 and T3 in the on state then couple the terminals 204 and 202, and the potential Vsw is then substantially equal to the potential Vbat. Preferably, during this operating phase, the circuit 3 applies the high state of signal cmd1 to the gate G1 of the transistor T1, so that the transistor T1 remains in the off state, thus avoiding current leakage from the terminal 200 to the terminal 204 via the transistors T3, T2 and T1.

Figure 2:
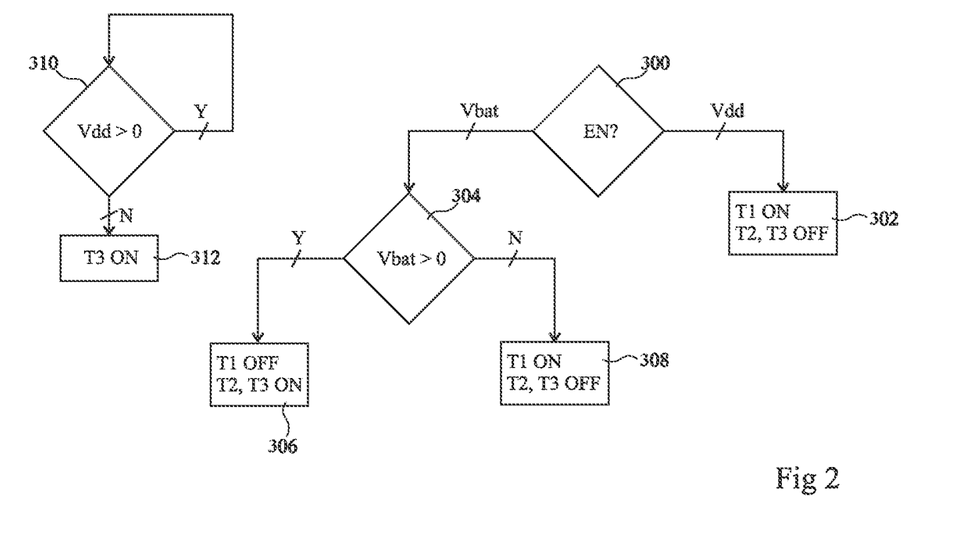
FIG. 2 represents an example of one embodiment of a method for controlling the switch of FIG. 1.

FIG. 2 represents an example of one embodiment of a method for controlling the switch 2 of FIG. 1, for example implemented by the circuit 3.

In a step 300 (block "EN?"), the circuit 3 observes the binary state of the signal EN.

In the step 300, if the signal EN is in its second binary state (output Vdd of block 200), for example the high state, this means that the circuit 3 must electrically couple the terminals 204 and 202, and electrically isolate the terminals 202 and 200. The step 300 is then followed by a step 302 (block "T1 ON T2, T3 OFF")

In the step 302, the circuit 3 controls the switching of the transistor T1 to the on state by applying the low state of the signal cmd1 to the gate G1 of the transistor T1, and the switching of transistors T2 and T3 to the off state, by applying the high state of the signal cmd2 to the gate G2 of the transistor T2 and the high state of the signal cmd3 to the gate G3 of transistor T3.

For example, in the step 302, if the potential Vsw is zero, as soon as the potential Vdd is higher than the threshold of the diode Di1, a current flows from the terminal 204 to the terminal 202, via the diode Di1 as described relative to FIG. 1. Thus, the potential Vsw increases until the transistor T1 is switched to the on state by circuit 3. At the same time, preferably, the circuit 3 maintains transistors T2 and T3 in the off state, for example, by maintaining the signal cmd2 in its high state (potential Vsw) and signal cmd3 in its high state (potential Vbat).

In the step 300, if signal EN is in its first binary state (output Vbat of block 200), for example, the low state, this means that circuit 3 must electrically couple the terminals 200 and 202, and electrically isolate the terminals 204 and 202. The step 300 is then followed by a step 304 (block "Vbat>0").

In the step 304, the circuit 3 checks whether the potential Vbat is zero, for example by comparing the potential Vbat to ground GND.

In the step 304, if the potential Vbat is non-zero (output Y of block 204), and, more precisely, strictly positive, the method continues at a step 306 (block "T1 OFF T2, T3 ON").

In the step 306, the circuit 3 controls the switching of the transistor T2 to the on state, by applying the low state of the signal cmd2 to the gate G2 of the transistor T2, the switching of transistor T3 to the on state, by applying the low state of the signal cmd3 to the gate G3 of transistor T3, and switching the transistor T1 to the off state, by applying the high state of the signal cmd1 to the gate G1 of the transistor T1.

For example, in the step 306, if the potential Vsw is zero, as soon as the potential Vbat is high enough for the transistor T3 to switch to the on state, a current flows from the terminal 200 to the terminal 202, via the transistor T3 in the on state and the diode Di2 as described as an example relative to FIG. 1. Thus, the potential Vsw increases until the transistor T2 is switched to the on state, by the circuit 3. At the same time, preferably, the circuit 3 maintains the transistor T1 in the off state, for example, by maintaining the signal cmd1 at its high state (potential Vsw).

In the step 304, if the potential Vbat is zero (output N of block 204), then it is preferable not to electrically couple the terminals 200 and 202 to each other. The method then continues at a step 308 (block "T1 ON T2, T3 OFF").

The step 308 is identical to step 302. Thus, in the step 304, if the potential Vdd is non-zero, for example below the threshold Vth but not zero, and the potential Vbat is zero, then implementing the step 308 maintains a non-zero potential Vsw.

When the circuit 3 implements the step 304, the circuit 3 is configured to condition the switching of the transistors T2 and T3 to the on state, and preferably the switching of the transistor T1 to the off state, due to the potential Vbat being non-zero. In other words, the circuit 3 is configured to control the on state of transistors T2 and T3, for example following the reception of the first binary state of the signal EN, only if, in addition, the potential Vbat is non-zero.

According to an alternative embodiment, the steps 304 and 306 may be omitted, the step 300 then being directly followed by the step 308 when the signal EN is in its first binary state during the step 300. In this variant, the circuit 3 is not configured to condition the switching of the transistors T2 and T3 to the on state, due to the fact that the potential Vbat is non-zero.

Preferably, although not shown in FIG. 2, each of the steps 302, 306, and 308 is followed by the step 300, so that the implementation of these steps is performed continuously or repeatedly.

According to one embodiment, the method further comprises a step 310 (block "Vdd>0?"). In the step 310, the circuit 3 checks whether the potential Vdd is zero, for example by comparing it to the ground GND.

At the step 310, if the potential Vdd is zero (output N of block 210), the method continues at a step 312 (block "T3 ON"). Otherwise (branch Y of block 210) step 310 is implemented again.

In the step 312, circuit 3 forces the transistor T3 to switch to the on state, for example by applying the low state of the signal cmd3 to the gate G3 of transistor 3. Thus, if the potential Vbat is sufficient, the transistor T3 is switched to the on state. This allows, when the potentials Vsw and Vdd are zero, but the potential Vbat is non-zero, to increase the potential Vsw by electrically coupling the terminals 200 and 202 via the transistor T3 which is in the on state and the diode Di2.

Although not shown in FIG. 2, preferably the step 312 is followed by the step 310, such that step 310 is implemented continuously or repeatedly.

Preferably, the switching of the transistor T3 to the on state resulting from the implementation of the step 312 overrides the switching of transistor T3 to the off state, resulting from the implementation of the step 308, or, in other words, takes precedence over the switching of transistor T3 to the off state, resulting from the implementation of the step 308.

In an alternative embodiment, the steps 310 and 312 are omitted. In one such variant, the circuit 3 is not configured to force a switching of the transistor T3 to the on state, when the potential Vdd is zero.

It has been described above in relative to FIGS. 1 and 2 the case where the maximum values of the gate-source voltage that can be supported by the transistors T1, T2 and T3 are higher than the maximum values of potentials Vbat and Vdd.

It would be desirable to be able to make the switch 2 with the transistors having maximum gate-source voltages of values lower than the maximum values of the potentials Vbat and Vdd. For example, this allows for an integrated circuit comprising the device 1 to be implemented entirely with MOS transistors having maximum gate-source voltages of values lower than the maximum potential values Vbat and Vdd. This results in a reduction in the surface area of the integrated circuit relative to the case where it is implemented with larger MOS transistors having maximum gate-source voltages higher than or equal to the maximum values of the potentials Vbat and Vdd.

Figure 3:
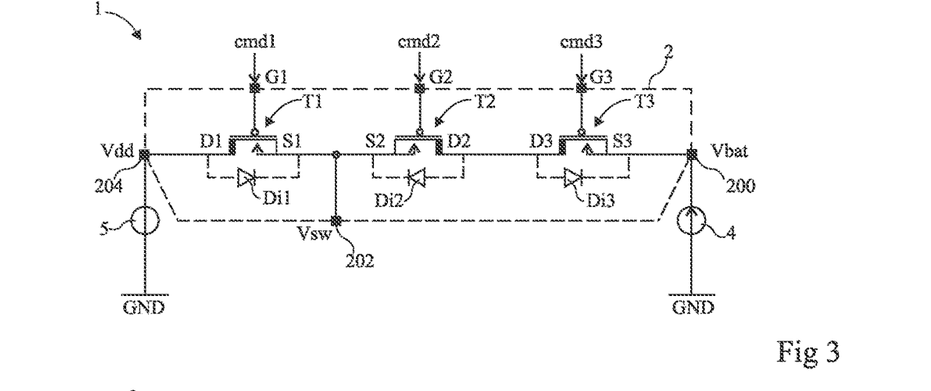
FIG. 3 represents another embodiment of the switch of FIG. 1.

FIG. 3 shows another embodiment of the switch 2 of FIG. 1.

In FIG. 3, the transistors T1, T2 and T3 are drift PMOS transistors.

The provision of drift transistors T1, T2, T3 allows each transistor T1, T2, T3 to support a maximum voltage between its source and its drain, or maximum drain-source voltage, and a maximum voltage between its gate and its drain, or maximum gate-drain voltage, higher than or equal to the maximum values of the potentials Vbat and Vdd.

On the other hand, it is considered here that the transistors T1, T2 and T3 each have a maximum gate-source voltage lower than the maximum values of the potentials Vbat and Vdd.

Thus, according to one embodiment, the control circuit 3 (not represented in FIG. 3) then comprises: a circuit configured to supply a high reference potential VrefHB equal to A times the supply potential Vbat and a low reference potential VrefLB equal to B times the supply potential Vbat, with A and B positive numbers strictly less than 1, A being greater than B; and a circuit configured to supply a high reference potential VrefHS equal to C times the supply potential Vsw and a low reference potential VrefLS equal to D times the supply potential Vsw, with C and D positive numbers strictly less than 1, C being greater than D.

According to one embodiment, the numbers A, B, C and D are determined by the maximum gate-source voltage supported by each of the transistors T1, T2 and T3. Preferably, the numbers A, B, C, and D are determined such that the difference between the potentials Vbat and VrefLB, the difference between the potentials VrefHB and GND, the difference between the potentials Vsw and VrefLS, and the difference between the potentials VrefHS and GND are each lower than the maximum gate-source voltage supported by each of the transistors T1, T2, and T3. In this way, the circuit 3 handles binary signals whose low and high states are equal to the potentials GND and VrefHB, GND and VrefHS, VrefLS and Vsw, and/or VrefLB and Vbat. These binary signals are compatible with the voltage holding properties of the transistors T1, T2 and T3, and, for example, of the MOS transistors of the device 1 such as, in particular, the transistors implementing the circuit 3.

According to one embodiment, the circuit 3 further comprises a circuit configured to supply a high reference potential VrefHM equal to E times the potential Vdd and a low reference potential VrefLM equal to F times the potential Vdd, with E and F being positive numbers strictly less than 1. Moreover, the number E is greater than the number F. In a similar manner to the numbers A, B, C and D, the numbers E and F are determined by the maximum potential difference that can be applied between the gate and the source of each of the transistors T1, T2 and T3. In other words, the numbers E and F are determined by the maximum gate-to-source voltage supported by each of the transistors T1, T2 and T3. Preferably, the numbers E and F are determined such that the difference between the potentials Vdd and VrefLM, and the difference between the potentials VrefHM and GND are each lower than the maximum gate-source voltage supported by each of the transistors T1, T2 and T3. In this way, circuit 3 can further handle the binary signals whose low and high states are equal to the potentials GND and VrefHM, and/or the potentials VrefLM and Vdd. These binary signals are compatible with the voltage handling properties of the transistors T1, T2, and T3, and, for example, of the MOS transistors of the device 1 such as, in particular, the transistors implementing the circuit 3.

Although not illustrated in FIG. 3, in one such embodiment, preferably, the circuit 6 (FIG. 1) is preferably powered by the difference between the potentials VrefHS and GND. In other words, preferably, the low state of the signal EN is then the ground potential GND and the high state of the signal EN is then the potential VrefHS. Furthermore, preferably in one such embodiment, the circuit 6 determines whether the potential Vdd is higher than the threshold Vth by comparing the potential VrefHM to a threshold Vth', where comparing the potential VrefHM to the threshold Vth' is equivalent to comparing the potential Vdd to the threshold Vth.

In the embodiment of FIG. 3, according to one embodiment, the high state of the signal cmd1 corresponds to the potential Vsw, the low state of the signal cmd1 corresponds to the potential VrefLS, the high state of the signal cmd2 corresponds to the potential Vsw, the low state of the signal cmd2 corresponds to the potential VrefLS, the high state of the signal cmd3 corresponds to the potential Vbat, and the low state of the signal cmd3 corresponds to the potential VrefLB.

According to one embodiment, the operation of the circuit 3, and preferably the operation of the circuit 6, are identical to what has been described relative to FIGS. 1 and 2, with the only difference that the low levels of signals cmd1, cmd2 and cmd3 no longer correspond to the GND potential, but instead correspond to the VrefLS potential, the VrefLS potential and the VrefLB potential, respectively.

The implementation of the circuit 3 in the case described relative to FIG. 3 is within the reach of the person skilled in the art from the functional and structural indications given above.

In particular, the person skilled in the art may implement the circuit 3 by means of circuits configured to generate the potentials VrefHB, VrefLB, VrefHS and VrefLS, and, for example, the circuit configured to generate the potentials VrefHM and VrefLM. These circuits are commonly referred to as Reference Voltage Generators. Examples of reference voltage generators are described in the paper by Kumar, et al., "Power Sequence free 400 Mbps 90 μW 6000 μm$^2$ 1.8V-3.3V Stress Tolerant I/O Buffer in 28 nm CMOS" presented in 2013 at the ESSCIRC conference (incorporated by reference). The person skilled in the art will be able to find other examples of such circuits in the literature.

Furthermore, to implement the circuit 3, and preferably the circuit 6, the person skilled in the art may use level shifter or splitter circuits configured to receive a binary signal having a low level corresponding to a first potential and a high level corresponding to a second potential, and to provide a binary signal having a low level corresponding to a third potential different from the first potential and a high level corresponding to a fourth potential, for example, different from the second potential. For example, the circuit 3 may comprise circuits configured to receive a binary signal between the potentials (or levels) VrefHS and GND, VrefHB and GND, and VrefHS and GND, and to provide a binary signal between the potentials (or levels) VrefHB and GND, Vbat and VrefLB, and Vsw and VrefLS respectively. Examples of such circuits are also described in the aforementioned article, although the person skilled in the art will be able to find other examples of such circuits in the literature.

Figure 4:
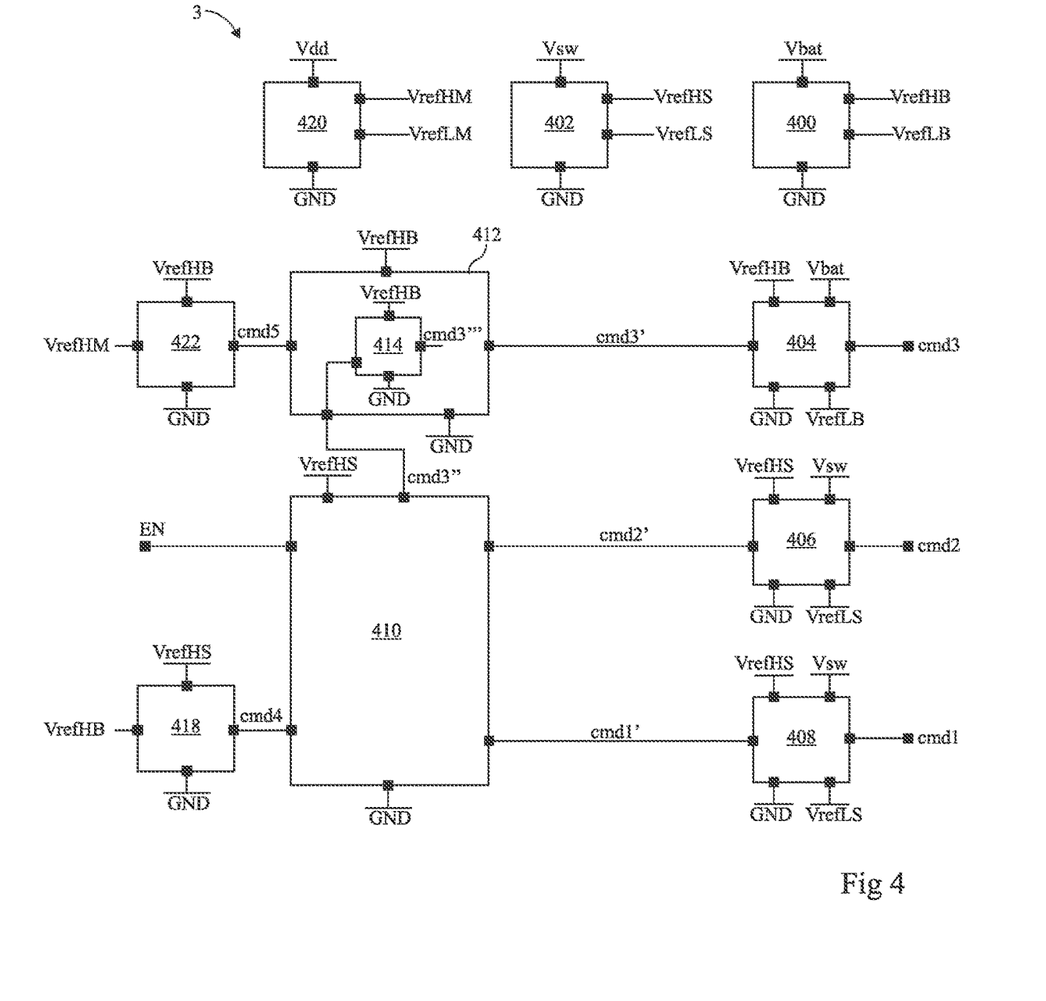
FIG. 4 represents, in block form and in more detail, one embodiment of the control circuit of the switch of FIG. 3.

FIG. 4 shows, in block form and in more detail, one embodiment of the control circuit 3 of the switch 2 of FIG. 3.

For example, the signal EN is in its first binary state when the potential Vdd is lower than the threshold Vth, and in its second binary state when the potential Vdd is higher than the threshold Vth. Preferably, the first binary state of the signal EN corresponds to the potential GND and the second binary state of the signal EN corresponds to the potential VrefHS.

In this embodiment, the circuit 3 comprises a circuit 400 of the type described above, configured to supply the potential VrefHB and the potential VrefLB. For example, the circuit 400 is configured to supply the potentials VrefHB and VrefLB from the potential Vbat, preferably from the difference between the potentials Vbat and GND. For example, the circuit 400 receives the potentials Vbat and GND, for example, at the power terminals of the circuit 400.

In this embodiment, the circuit 3 further comprises a circuit 402 of the type described above, configured to supply the potential VrefHS and the potential VrefLS. For example, the circuit 402 is configured to supply the potentials VrefHS and VrefLS from the potential Vsw, preferably from the difference between the potentials Vsw and GND. For example, the circuit 402 receives the potentials Vsw and GND, for example, at the power terminals of the circuit 402.

According to one embodiment, the control circuit 3 comprises the circuits 404, 406 and 408, of the type described above.

The circuit 404 is configured to receive a binary signal cmd3' between the ground GND and the potential VrefHB and to provide, to gate G3 of transistor T3 (not shown in FIG. 4), the binary signal cmd3. The signal cmd3 is determined by the signal cmd3' and is between the potential Vbat and the potential VrefLB. In other words, the signal cmd3 corresponds to the signal cmd3' with the difference that the signal cmd3 is between the potentials Vbat and VrefLB while the signal cmd3' is between the potentials VrefHB and GND. Preferably, the signal cmd3 is in the low state, respectively high, when the signal cmd3' is in the low state, respectively high. For example, the circuit 404 receives the difference between the potentials Vbat and VrefLB and the difference between the potentials VrefHB and GND, for example, at four respective power terminals.

The circuit 406 is configured to receive a binary signal cmd2' between the ground GND and the potential VrefHS and to provide, at the gate G2 of the transistor T2 (not shown in FIG. 4), the binary signal cmd2. The signal cmd2 is determined by the signal cmd2' and is between the potential Vsw and the potential VrefLS. In other words, the signal cmd2 corresponds to the signal cmd2' with the difference that the signal cmd2 is between the potentials Vsw and VrefLS while the signal cmd2' is between the potentials VrefHS and GND. Preferably, the signal cmd2 is in the low state, respectively high, when the signal cmd2' is in the low state, respectively high. For example, the circuit 406 receives the difference between the potentials Vsw and VrefLS and the difference between the potentials VrefHS and GND, for example, at four respective power terminals.

Circuit 408 is configured to receive a binary signal cmd1' between the ground GND and the potential VrefHS and to provide, at the gate G1 of the transistor T1 (not shown in FIG. 4), the binary signal cmd1. The signal cmd1 is determined by the signal cmd1' and is between the potential Vsw and the potential VrefLS. In other words, the signal cmd1 corresponds to the signal cmd1' with the difference that the signal cmd1 is between the potentials Vsw and VrefLS while the signal cmd1' is between the potentials VrefHS and GND. Preferably, the signal cmd1 is in the low, respectively high, state when the signal cmd1' is in the low, respectively high, state. For example, the circuit 408 receives the difference between the potentials Vsw and VrefLS and the difference between the potentials VrefHS and GND, for example, at four respective power terminals.

In a similar manner to the signals cmd1, cdm2, and cmd3, the signals cmd1', cmd2', and cmd3' are at least in part determined by the signal EN, i.e., by the binary state or potential level of the signal EN.

More particularly, according to one embodiment, the control circuit 3 comprises a circuit 410 and a circuit 412.

The circuit 410 is configured to receive the signal EN, and to provide the signals cmd2' and cmd1'. The circuit 410 is further configured to provide a binary signal cmd3" determining, at least in part, the state of the signal cmd3'. The signal cmd3" is, like the signals cmd1', cmd2' and EN, between the potentials VrefHS and GND.

The circuit 410 is powered by the difference between the potentials VrefHS and GND, and receives, for example, the potentials VrefHS and GND at two respective power terminals. Supplying the circuit 410 with the VrefHS potential results from the fact that the signals EN, cmd1' and cmd2' are between the potentials VrefHS and GND, and allows, for example, the maximum voltage that the MOS transistors of the circuit 410 can withstand between two of their terminals (gate, source, drain) to be lower than the maximum values of the potentials Vbat and Vsw.

The circuit 412 is configured to receive the signal cmd3",
and to provide the signal cmd3'. The circuit 412 is powered
by the difference between the potentials VrefHB and GND,
and receives, for example, the potentials VrefHB and GND
on two respective power terminals. This allows, for
example, the maximum voltage that the MOS transistors of
the circuit 412 can withstand between two of their terminals
(gate, source, drain) to be less than the maximum values of
the potentials Vbat and Vsw.

According to one embodiment, to determine the signal
cmd3' at least in part from the signal cmd3", the circuit 412
includes a circuit 414.

The circuit 414 is configured to receive the signal cmd3"
between the potentials VrefHS and GND and to provide a
binary signal cmd3'" between the potentials VrefHB and
GND. The signal cmd3'" is determined by the signal cmd3".
In other words, the signal cmd3'" corresponds to the signal
cmd3" with the difference that the signal cmd3'" is between
the potentials VrefHB and GND while the signal cmd3" is
between the potentials VrefHS and GND. Preferably, the
signal cmd3'" is in the low state, respectively high, when the
signal cmd3" is in the low state, respectively high. For
example, the circuit 414 receives the difference between the
potentials VrefHB and GND, for example, at two respective
power supply terminals.

In the embodiment illustrated in FIG. 4, the circuit 3 is
configured to condition a switching of the transistors T2 and
T3, to the on state, when required by the signal EN, due to
the fact that the potential Vbat is non-zero.

The circuit 3 then comprises a circuit 418. The circuit 418
is configured to provide a binary signal cmd4, a first binary
state of which, for example the low state, indicates that the
potential Vbat is strictly positive, and thus non-zero, and a
second binary state of which, for example the high state,
indicates that the potential Vbat is zero. To this end, the
circuit 418 preferably receives the signal VrefHB.

The signal cmd4 is between the potentials VrefHS and
GND. In other words, the low state of the signal cmd4
corresponds to the potential GND and the high state of the
cmd4 signal corresponds to the potential VrefHS. The circuit
418 is powered by the difference between the potentials
VrefHS and GND and receives, for example, the potentials
VrefHS and GND at respective power terminals.

For example, the circuit 418 comprises a comparator
circuit, preferably powered by the difference between the
potentials VrefHS and GND, configured to compare the
potential VrefHB to the potential GND. Indeed, because the
potential VrefHB is equal to A times the potential Vbat, the
potential VrefHB is strictly positive, respectively zero, when
the potential Vbat is strictly positive, respectively zero.

The signal cmd4 is received by the circuit 410, or, in other
words, provided by the circuit 418 to the circuit 410. In one
such embodiment, the circuit 410 is configured to provide
the signals cmd1', cmd2' and cmd3" from the signals EN and
cmd4.

For example, when the circuit receives the first binary
state of the signal EN, indicating a request to switch transistors T2 and T3 to the on state, and the signal cmd4
indicates that the potential Vbat is strictly positive, the
circuit 410 provides the signals cmd3", cmd1', and cmd2' so
as to control a switching of the transistors T2 and T3 to the
on state and a switching of the transistor T1 to the off state.
On the other hand, if the circuit 410 receives the second
binary state of the signal EN and/or the signal cmd4 indicates that the potential Vbat is zero, the circuit 410 provides
the signals cmd3", cmd1' and cmd2' so as to control a
switching of the transistors T2 and T3 to the off state and a
switching of the transistor T1 to the on state.

For example, the circuit 410 is implemented by combinational logic gates implemented by MOS transistors, the
logic gates preferably being powered by the difference
between the potentials VrefHS and GND. The logic gates are
configured to provide the signals cmd3", cmd1' and cmd2'
from the signals EN and cmd4.

In an alternative embodiment not shown, the circuit 3 is
not configured to condition a switching of the transistors T2
and T3 to the on state, when required by the signal EN, on
the potential Vbat being non-zero.

In this variant, the circuit 418 may be omitted. For
example, the circuit 410, for example the combinational
logic gates implementing it, is then configured to determine
the signals cmd3", cmd2' and cmd1' solely from the signal
EN.

In the embodiment illustrated in FIG. 4, the circuit 3 is
further configured to force a switching of the transistor T3
to the on state when the potential Vdd is zero.

The circuit 3 then comprises a circuit 420 and a circuit
422.

The circuit 420 of the type previously described relative
to FIG. 3, is configured to supply the potential VrefHM and
the potential VrefLM. For example, the circuit 420 is configured to supply the potentials VrefHM and VrefLM from
the potential Vdd, preferably from the difference between
the potentials Vdd and GND. For example, the circuit 420
receives the potentials Vdd and GND, for example, at the
power supply terminals of the circuit 420.

The circuit 422 is configured to provide a binary signal
cmd5 having a first binary state, for example the high state,
indicating that the potential Vdd is strictly positive, and thus
non-zero, and of which a second binary state, for example
the low state, indicates that the potential Vdd is zero. To this
end, the circuit 418 preferably receives the signal VrefHM.

The signal cmd5 is between the potentials VrefHB and
GND. In other words, the low state of the signal cmd5
corresponds to the potential GND and the high state of the
signal cmd5 corresponds to the potential VrefHB. The
circuit 422 is powered by the difference between the potentials VrefHB and GND and receives, for example, the
potentials VrefHB and GND at respective power terminals.

For example, circuit 422 comprises a comparator circuit,
preferably powered by the difference between potentials
VrefHB and GND, configured to compare the potential
VrefHM to potential GND. Indeed, because the potential
VrefHM is equal to E times the potential Vdd, the potential
VrefHM is strictly positive, respectively zero, when the
potential Vdd is strictly positive, respectively zero.

The signal cmd5 is received by the circuit 412, or, in other
words, provided by the circuit 422 to the circuit 412. In one
such embodiment, the circuit 412 is configured to provide
signals cmd3' from the signals cmd3" and cmd5, or, in other
words, from signals cmd3'" and cmd5.

For example, when the signals cmd5 and cmd3" received
by the circuit 412 indicate, respectively, that the potential
Vdd is strictly positive and that the transistor T3 should be
switched to the off state, the circuit 412 provides the signal
cmd3' so as to command the transistor T3 to be switched to
the off state. On the other hand, if the signal cmd5 indicates
that the potential Vdd is zero and/or if the signal cmd3"
indicates that the transistor T3 is to be switched to the on
state, the circuit 412 provides the signal cmd3' so as to
control a switching of the transistor T3 to the on state.

For example, the circuit 412, with the exception of its
circuit 414, is implemented by the combinational logic gates implemented by the MOS transistors, the logic gates preferably being powered by the difference between the potentials VrefHB and GND. The supply of the circuit 412 by the potential VrefHB results from the fact that the two signals cmd3''' and cmd5 are between the potentials VrefHB and GND. The logic gates of the circuit 412 are configured to provide the signal cmd3' from the signals cmd5 and cmd3'''.

In an alternative embodiment not shown, the circuit 3 is not configured to force a switching of the transistor T3 to the on state when the potential Vdd is zero.

In this variant, the circuits 420 and 422 may be omitted from the circuit 3, although the circuit 420 may still be provided in the circuit 6 (FIG. 1). For example, the circuit 412, for example the combinational logic gates that implement it, is then configured to determine the signal cmd3' only from the signal cmd3'', thus the signal cmd3'''.

According to one embodiment, the circuit 3 implements the embodiment or one of the alternative embodiments of the method described relative to FIG. 2.

Figure 5:
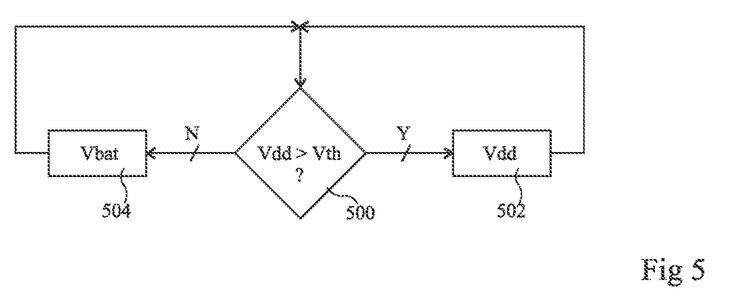
FIG. 5 illustrates one embodiment of a method for providing a control signal to the control circuit of FIG. 4.

FIG. 5 illustrates one embodiment of a method for providing the control signal EN to the circuit 3 of FIG. 1 or 4. For example, this method is implemented by the circuit 6 (FIG. 1).

At a step 500 (block "Vdd>Vth?"), the potential Vdd is compared to the threshold Vth.

According to one embodiment in which the transistors T1, T2, and T3 are configured to support a maximum source-gate voltage higher than or equal to the potentials Vdd and Vbat, the circuit 6 (FIG. 1) comprises a comparator circuit configured to compare the potential Vdd to the threshold Vth. The comparator circuit is then powered by the difference between the potentials Vsw and GND, so that the signal EN is between the potentials Vsw and GND.

According to one embodiment in which the transistors T1, T2, and T3 are configured to support a maximum source-gate voltage lower than the potentials Vdd and Vbat, the circuit 6 (FIG. 1) comprises a comparator circuit configured to compare the potential VrefHM to a threshold Vth' determined by the threshold Vth, so that the comparison of the potential VrefHM to the threshold Vth' is equivalent to comparing the potential Vdd to the threshold Vth. The comparator circuit is then supplied with the difference between the potentials VrefHS and GND, so that the signal EN is between the potentials VrefHS and GND.

If the potential Vdd is higher than the threshold Vth (output Y of block 500), the method continues at a step 502 (block "Vdd"). In the step 502, the signal EN is switched to its second binary state, or, in other words the circuit 3 receives a request to switch the transistor T1 to the on state and switch the transistors T2 and T3 to the off state. The step 502 is followed by the step 500.

According to one embodiment in which the transistors T1, T2, and T3 are configured to support a maximum source-to-gate voltage greater than or equal to the potentials Vdd and Vbat, the second binary state of the signal EN corresponds to the potential Vsw.

According to one embodiment in which the transistors T1, T2, and T3 are configured to support a maximum source-gate voltage lower than the potentials Vdd and Vbat, the second binary state of the signal EN corresponds to the potential VrefHS.

If the potential Vdd is lower than the threshold Vth (output N of block 500), the method continues at a step 504 (block "Vbat"). In the step 504, preferably immediately after the potential Vdd becomes lower than the threshold Vth, the signal EN is switched to its first binary state, or, in other words, the circuit 3 receives a request to switch the transistor T1 to the off state and switch the transistors T2 and T3 to the on state. The step 504 is followed by the step 500.

According to one embodiment, the first binary state of the EN signal corresponds to the potential GND.

Although not detailed above, preferably, when the potential Vsw is not sufficient for the circuit 6 to implement the comparison of the potential Vdd to the threshold Vth, i.e., when the potential Vsw is not sufficient to power the circuit 6, for example, at the beginning of the operation of the device 1 when the potential Vsw is still zero, the signal EN is by default kept at the low state, i.e., at the potential GND. In other words, when the potential Vsw is not sufficient to supply the circuit 6 correctly, the signal EN is by default in the low state indicating to the circuit 3 a request to switch the transistor T1 to the off state and to switch the transistors T2 and T3 to the on state.

According to one embodiment, the transistors T1, T2 and T3 and the transistors of the circuit 3 and, preferably, of the circuit 6, are MOS transistors having a gate oxide the thickness of which is substantially equal to, for example, equal to 32 angstroms, the channel length of these transistors being, for example, substantially equal to, preferably equal to, 28 nm. For example, these transistors are configured to support a maximum drain-to-source voltage, a maximum source-to-gate voltage, and a maximum drain-to-gate voltage substantially equal to 1.8 V when they are not at extended drain, and to support a maximum drain-to-source voltage and a maximum drain-to-gate voltage higher than 1.8 V when at extended drain although the maximum gate-to-source voltage they support remains substantially equal to 1.8 V.

Various embodiments and variants have been described. Those skilled in the art will understand that certain features of these embodiments can be combined and other variants will readily occur to those skilled in the art. In particular, although a circuit 420 configured to supply not only the potential VrefHM, but also the potential VrefLM has been described, in alternative embodiments the circuit 420 is configured to provide the potential VrefHM without supplying the potential VrefLM.

Finally, the practical implementation of the embodiments and variants described herein is within the capabilities of those skilled in the art based on the functional description provided hereinabove. In particular, implementation of the described circuits, including circuits 410 and 412, is within the scope of the person skilled in the art from the functional and structural indications given above.

The invention claimed is:

1. A device, comprising:
   a first terminal configured to connect to a first voltage source supplying a first supply potential referenced to ground;
   a second terminal configured to supply a second potential referenced to ground;
   a third terminal configured to connect to a second voltage source supplying a third supply potential referenced to ground;
   a first PMOS transistor having a source connected to the second terminal and a drain connected to the third terminal;
   a second PMOS transistor having a source connected to the second terminal;
   a third PMOS transistor having a source connected to the first terminal and a drain connected to the drain of the second PMOS transistor;
   a control circuit configured to generate gate control signals for controlling the first, second, and third transistors, the control circuit being configured to receive the first, second, and third supply potentials;

wherein the control circuit comprises:
- a first circuit configured to supply a first high reference potential equal to A times the first supply potential and a first low reference potential equal to B times the first supply potential, with A and B positive numbers strictly less than 1, A being greater than B; and
- a second circuit configured to supply a second high reference potential equal to C times the second supply potential and a second low reference potential equal to D times the second supply potential, with C and D positive numbers strictly less than 1, C being greater than D.

2. The device of claim 1, wherein the control circuit is further configured to compare the third supply potential to ground, and to force a switching of the third transistor to the on state when the third supply potential is zero and the first supply potential is non-zero.

3. The device of claim 1, wherein the control circuit is further configured to compare the third supply potential to ground, and to force a switching of the third transistor to the on state when the third supply potential is zero.

4. The device of claim 1, wherein a maximum potential difference that can be applied between the gate and the source of each of the first, second and third transistors determines the numbers A, B, C and D.

5. The device of claim 1, wherein the control circuit comprises:
- a third circuit configured to receive a second binary signal comprised between ground and the first high reference potential and to provide, at the gate of the third transistor, a third binary signal determined by the second binary signal and comprised between the first low reference potential and the first supply potential;
- a fourth circuit configured to receive a fourth binary signal comprised between ground and the second high reference potential and to provide, at the gate of the second transistor, a fifth binary signal determined by the fourth binary signal and comprised between the second low reference potential and the second supply potential; and
- a fifth circuit configured to receive a sixth binary signal comprised between ground and the second high reference potential and to provide, at the gate of the first transistor, a seventh binary signal determined by the sixth binary signal and comprised between the second low reference potential and the second supply potential.

6. The device of claim 5, wherein the control circuit comprises:
- a sixth circuit configured to be powered between the second high reference potential and ground, to receive the first binary signal, to provide the fourth and sixth binary signals;
- a seventh circuit configured to be powered between the first high reference potential and ground, to receive a binary signal from the sixth circuit comprised between the second high reference potential and ground, and to provide the second binary signal at least from the binary signal received from the sixth circuit.

7. The device of claim 6, wherein the sixth circuit is configured to determine the state of the fourth and sixth signals and of the binary signal that the sixth circuit provides to the seventh circuit at least based on the first binary signal.

8. The device of claim 6, wherein:
- the control circuit further comprises an eighth circuit configured to receive the first high reference potential, to detect when the first high reference potential is strictly positive, and to provide to the sixth circuit an eighth binary signal comprised between the second high reference potential and ground and having a binary state determined by said detection, and
- the sixth circuit is configured to determine the state of the fourth and sixth binary signals and of the binary signal that the sixth circuit provides to the seventh circuit at least based on the first binary signal and the eighth binary signal.

9. The device of claim 6, wherein the seventh circuit comprises a ninth circuit configured to receive the binary signal received from the sixth circuit and provide a ninth binary signal determined by the received binary signal and comprised between ground and the first high reference potential, the seventh circuit being configured to determine the state of the second binary signal at least based on the ninth binary signal.

10. The device of claim 6, wherein:
- the control circuit comprises a tenth circuit configured to supply a third high reference potential equal to E times the third supply potential, with E a positive number strictly less than 1 determined by the maximum potential difference that can be applied between the gate and the source of each of the first, second and third transistors;
- the control circuit comprises an eleventh circuit configured to receive the third high reference potential, to detect when the third high reference potential is strictly positive, and to provide the seventh circuit with a tenth binary signal comprised between the first high reference potential and ground and having a binary state determined by said detection; and
- the seventh circuit is configured to determine the state of the second binary signal at least based on the binary signal received from the sixth circuit and the tenth binary signal.

11. The device of claim 1, wherein the first, second, and third PMOS transistors are drift PMOS transistors.

12. The device of claim 1, further comprising the first and second voltage sources.

* * * * *